United States Patent [19]
Morley

[11] Patent Number: 5,928,526
[45] Date of Patent: Jul. 27, 1999

[54] METHOD FOR MANUFACTURING A SUBSTRATE HAVING AN IRREGULAR SHAPE

[75] Inventor: Bruce A. Morley, Sunnyvale, Calif.

[73] Assignee: Stellex Microwave Systems, Inc., Palo Alto, Calif.

[21] Appl. No.: 08/845,810

[22] Filed: Apr. 29, 1997

[51] Int. Cl.$^6$ ........................................................ B44C 1/22
[52] U.S. Cl. ............................................. 216/65; 216/17
[58] Field of Search ................................. 216/13, 17, 20, 216/56, 65, 76, 77, 78; 174/250, 254, 255; 428/209, 901; 219/121.68, 121.69; 427/96

[56] References Cited

U.S. PATENT DOCUMENTS

| | | | |
|---|---|---|---|
| 2,706,697 | 4/1955 | Eisler | 216/20 |
| 4,681,656 | 7/1987 | Byrum | 216/65 |
| 5,116,641 | 5/1992 | Patel et al. | 427/96 |
| 5,676,855 | 10/1997 | Schulz-Harder | 216/65 X |

FOREIGN PATENT DOCUMENTS 831735  2/1996  Japan .

OTHER PUBLICATIONS

Freyman, B.J., "Laser Drilling of Alumina Substrates for Thin Film Applications", Motorola Portable Products Division, Ft. Lauderdale, FL, pp. 596–601.

Siekman J.G., "Analysis of Laser Drilling and Cutting Results in Al$_2$O$_3$ and Ferrites", American Institute of Physics, pp. 225–231.

Kugler, T. R., et al., "Ceramic Machining and Scribing Systems", presented at Laser in Electronics Manufacturing, Apr. 29–May 1, 1986, The Hyatt San Jose, San Jose, California.

*Primary Examiner*—William Powell
*Attorney, Agent, or Firm*—Mikio Ishimaru

[57] ABSTRACT

A method and apparatus for a substrate having an irregular shape is provided. Using a laser, a first series of laser drilled wells, having a first spacing, are made in the substrate material to define a substantial portion of the perimeter of the irregular shaped substrate. a second series of laser drilled wells, having a second spacing are made in the substrate material to form the remaining portion of the perimeter of the irregular shaped substrate. The second series of laser drilled wells form a "tab" which provides a more rigid tack to the substrate material thereby giving greater adhesion of the substrate to the panel of substrate material, wherein the irregular shaped substrate is retained in the panel of substrate material without breaking. Upon completion of processing, the irregular shaped substrates are easily removed from the panel. Also provided is an irregular shaped substrate comprising a substrate having a perimeter with at least one rounded corner and wherein the perimeter does not substantially form a square.

41 Claims, 6 Drawing Sheets

METHOD FOR MANUFACTURING A SUBSTRATE HAVING AN IRREGULAR SHAPE

FIELD OF THE INVENTION

The present invention relates generally to a method and apparatus for forming substrates used in the electronic circuit industry. More specifically, the present invention relates to irregular shaped substrates and a method for producing such substrates.

BACKGROUND OF THE INVENTION

In the electronics industry, circuits are formed on a variety of substrate materials. Alumina ($Al_2O_3$) is a widely used material, and typically a panel of alumina substrate material is provided from which individual substrates are eventually cut. Using known processing methods, the substrates are limited to square or rectangular shapes cut from the substrate material. Lasers are generally used to cut the substrates using a variety of techniques. In one technique, the substrate panels are perforated prior to processing of the substrates to form hybrid circuits. At the completion of processing, the panel is snapped along the perforations to form individual substrates with the circuits formed thereon. Using this method the perforations can only penetrate a slight distance into the depth of the substrate material, such as by approximately 25%, in order to retain mechanical stability during processing. This technique is not compatible with thin substrate panels, such as 10 and 15 mil thick panels. This technique allows only for the formation of square and rectangular substrates with sharp corners. Irregular shaped substrates cannot be snapped from the rigid panel without breaking.

Another known technique is dicing with a saw. Large substrate material panels are mounted with wax onto a glass plate, or are mounted with tape to a template. Typically, a six mil diamond saw is used to dice the individual substrates, completely penetrating the substrate material. The individual circuits are held on by the wax backing and tape, and then are picked off with tweezers, or the wax is melted leaving the substrates. This technique provides square or rectangular circuits only. It is possible that some internal cutouts in the substrate may be realized using this technique, however complex irregular shapes, fragile substrates, or complex cutouts cannot be realized with this technique because the substrates will crack when mounted and de-mounted rendering this technique useless for producing irregular shaped substrates.

With either technique, only square or rectangular substrates may be formed as shown in FIG. 1. FIG. 1 shows a panel of substrate material 5 with a plurality of individual rectangular substrates 6 formed therein. The individual substrates 6 are formed by breaking the substrate material along a plurality of scribe lines 7. As shown in FIG. 1, all of the individual substrates have formed thereon the same circuit traces. A further limitation of these methods is that many masks are required in order to create hybrid circuits on the substrates needed for a product utilizing various circuit designs such as a receiver module, antenna module and the like. For example, in an circuit design employing channelized modules, many individual rectangular and square substrates are needed to implement the design. Typically, only one circuit is prepared from a mask and thus many masks are needed to produce different circuits. If a technique were developed which produced irregular shaped substrates, multiple hybrid circuits could be fabricated on one substrate thereby reducing the number of individual substrates and masks needed to implement a design. Moreover, combining multiple individual irregular shaped substrates on a single photomask will further reduce the prototype cost and production cycle time.

Another limitation of many rectangular and square substrates is the amount of Wire bonding needed to connect the individual circuits. Wiring bonding is a time consuming process which effects assembly and performance of the circuit. Variability is introduced into the circuit with each bond wire, and such variation requires that aligning (or tuning) operations be preformed. Thus it is desirable to provide a substrate capable of replacing a number of square and rectangular substrates and thus reducing cost, time, and the need for alignment operations.

Additionally, space utilization in a modular design of circuits is a concern with the use of square and rectangular substrates. Specifically, the square corners on such substrates require the use of corner reliefs around the corners in the module housing, otherwise the substrates may ride up and not fit properly. This limits how closely to one another the substrates may be placed. Accordingly it is desirable to provide a substrate that minimizes the requirement for corner reliefs. As stated above, it is critical that the substrates withstand all of the required processing. If irregular shapes are made with substrates and then taped or waxed onto a backboard for processing as done in the prior art, the protrusions and non-rectangular portions of the irregular shaped substrates are delicate and will crack during saw processing and during removal from the backboard. Secondly, if the irregular shaped substrates are scribed in the substrate material prior to processing, the known techniques require a low penetration scribe line to retain mechanical stability throughout processing. With this technique, relatively high force is required to break the substrates free from the panel. Using this technique it is not possible to pop the irregular shaped substrates from the panel without breaking the delicate irregular shapes. Thus it is desirable to provide an irregular shaped substrate and a method capable of forming the same.

OBJECTS AND SUMMARY OF THE INVENTION

Accordingly, it is an object of the present invention to provide an irregular shaped substrate and a method for producing the same.

Another object of the present invention is to provide a method of producing irregular shaped substrates using a laser to define the shape of said substrates.

Yet another object of the present invention is to provide a substrate that has at least one rounded corner and minimizes the requirement for corner reliefs.

A further object of the present invention is to provide an irregular shaped substrate which reduces the number of individual substrates required to implement a circuit design.

Another object of the present invention is to provide a method for producing irregular shaped substrates on a single photomask which reduces cost and processing time and enables quick prototype designs.

Another related object of the present invention is to provide an irregular shaped substrate with hybrid circuits formed thereon which reduces cost, time and aligning operations as compared to square and rectangular substrates.

These and other objects and advantages are achieved by the method of the present invention wherein irregular shaped substrates are produced from a panel of substrate material. Using a laser, a first series of laser drilled wells, having a first spacing, are made in the substrate material to define a substantial portion of the perimeter of the irregular shaped substrates. Preferably, the first series is a series of overlapping holes drilled substantially through the substrate whereby a portion of the substrate material reflows to form a perforated cut. Next, a second series of laser drilled wells, having a second spacing are made in the substrate material to form the remaining portion of the perimeter of the irregular shaped substrate. The second series of laser drilled wells form a "tab" which provides a more rigid tack to the substrate material thereby giving greater adhesion of the substrate to the panel of substrate material, wherein the irregular shaped substrate is retained in the panel of substrate material without breaking. Upon completion of processing, the irregular shaped substrates are easily removed from the panel.

In an alternative embodiment of the invention, an irregular shaped substrate is provided, comprising a substrate having a perimeter with at least one rounded corner and wherein the perimeter does not substantially form a square.

BRIEF DESCRIPTION OF THE DRAWINGS

Additional objects and features of the present invention will become apparent upon reading of the detailed description of the invention and the appended claims provided below, and upon reference to the drawings in which:

DETAILED DESCRIPTION OF THE INVENTION

Figure 2:
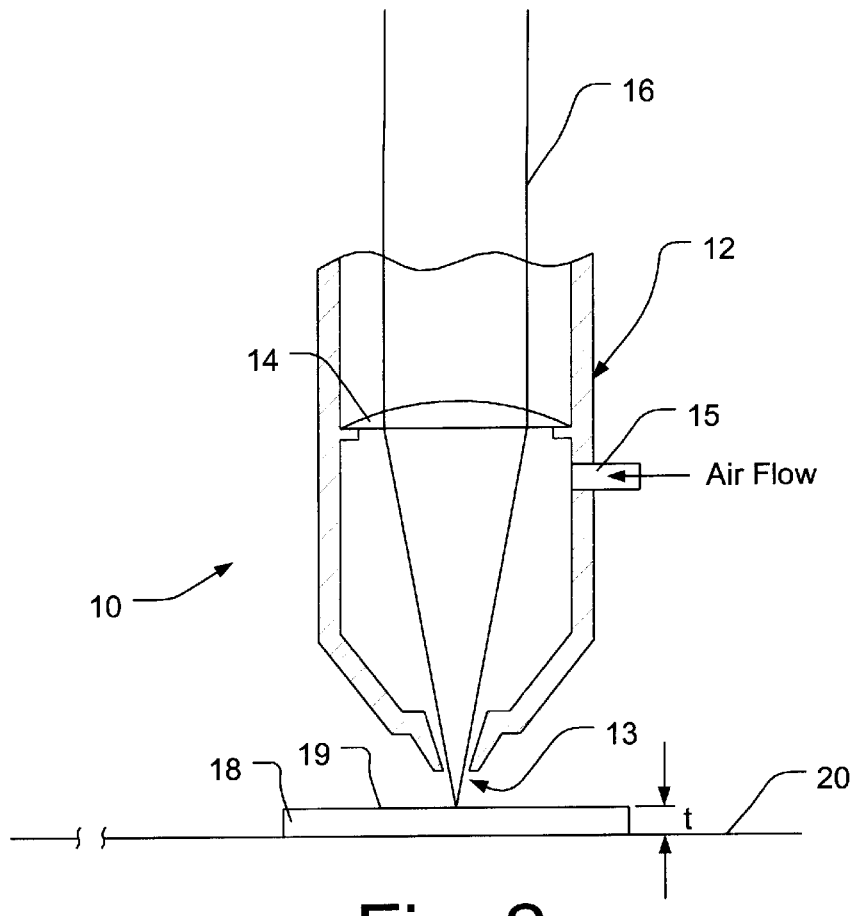
FIG. 2 shows a simplified cross-sectional view of a portion of a laser which may be used to practice the method of the present invention.

Turning to the drawings, wherein like components are designated by like reference numbers in the figures, FIG. 2 shows a simplified cross-sectional view of a portion of a laser 10 which may be used in accordance with the method of the present invention. The laser 10 includes a beam delivery assembly with a cylindrical housing 12 terminated in a conical end having a circular opening 13. The housing 12 contains a focusing lens 14. Additionally, the housing 12 includes an inlet 15 for receiving an assist gas, which is typically air. A laser beam 16 is focused through the opening 13 by a lens 14 and on to a panel of substrate material 18 positioned underneath the opening 13. The panel of substrate material 18 has a surface 19 and a thickness t. The laser beam "drills" by focusing the energy of the laser onto the substrate material 18 to vaporize or melt the substrate to form a blind hole, or well. The wells may vary in size and depth depending upon the penetration of the laser beam into the panel of substrate material 18. Through holes are formed when the beam penetrates through the entire thickness t of the substrate 18. Generally, the panel of substrate material 18 is mounted on a table 20, which positions the substrate underneath the opening 13 to form wells in a desired pattern in response to movement of the table, responsive to a control means (not shown).

In the preferred embodiment, a $CO_2$ laser, such as a Lumonics V150 slow flow $CO_2$ laser equipped with a simple beam delivery assembly and a CNC controller such as an Anorad III system is used. The CNC controller has the capability to vary the pulsing parameters and power levels of the laser, as well as to direct x and y movement of the table 20. The lens 14 is of high quality, such as a 2.5 inch focal length aspheric ZnSe lens, or the like. The processing mode of the laser may be set for gaussian (also referred to as the $TEM_{00}$ mode). This mode focuses the laser beam into the smallest point possible, and allows for the most efficient material removal. The shape of the beam at the focus resembles a bell curve, where the beam is hottest at the center of the focal plane and cooler away from the center.

Air flow as an assist gas is provided coaxially with the laser beam 16 through inlet 15.air flow is provided at a pressure in the range of substantially 15 to 25 psi, depending on the type of cut or well to be made. To convey the proper air flow, a voltage controlled air regulator may be used (not shown). The air strikes the surface 19 of the panel of substrate material 18 and acts to remove debris generated by the laser penetration. Regulation of the assist gas air flow is important. For the first series of wells, preferably the perforated cut, too much air flow will open up the cut, causing the circuit to fall out of the panel; too little air flow will close the cut and prevent the circuit from breaking out. For the second series of wells, too much air flow will splatter material onto the circuits; and too little air flow will not allow adequate well penetration and cause problems when breaking the circuit out of the panel.

Of particular advantage, the present invention provides for the formation of irregular shaped substrates by making a series of laser drilled wells in the panel of substrate material 18. The formation of irregular shaped substrates are enabled by the method of the present invention which employs different laser parameters to form different laser drilled wells which form the outlines of the irregular shapes in the substrate material 18 itself prior to the completion of processing. The different types of wells maintain rigidity during processing, yet allow for ease of removal without breakage of the delicate irregular shapes at the end of laser processing when the substrates are separated from the panel of substrate material 18 to form individual circuits.

Figure 3A:
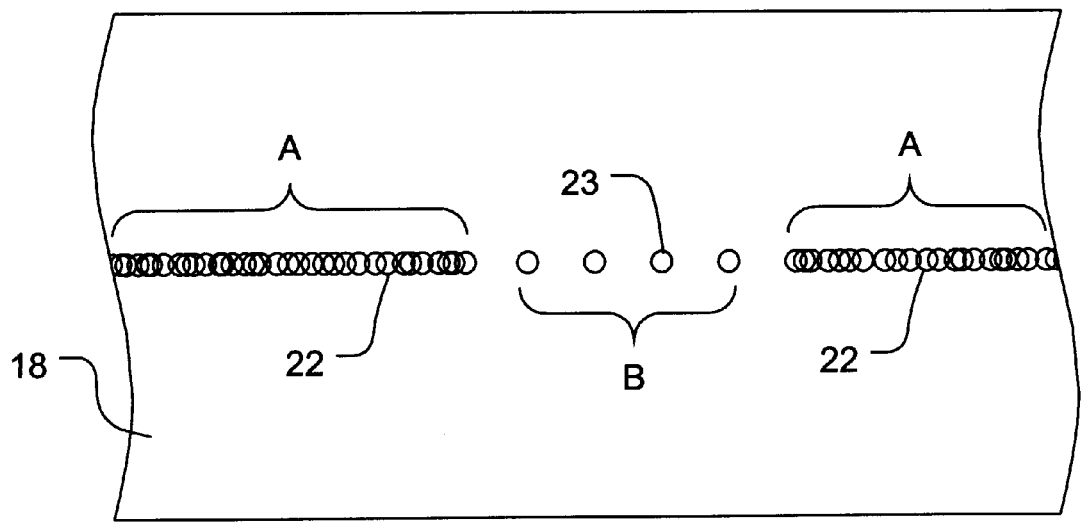
FIGS. 3a and 3b are a planar view and cross-sectional view, respectively, of a portion of a panel of substrate material showing first and second series of wells formed therein in accordance with one embodiment of the present invention.
Figure 3B:
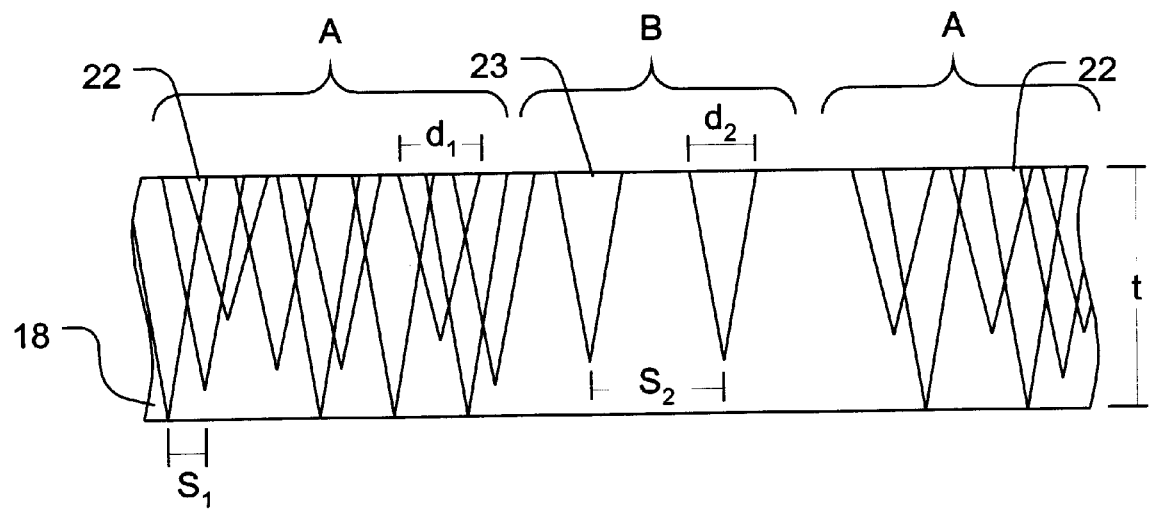

Turning to FIGS. 3 and 4, two different series of laser drilled wells are shown in top view and cross-sectional view, respectively, of a portion of the substrate panel material 18. These different series of wells are used to define the perimeter of an irregular shaped substrate formed into the panel of substrate material 18. In FIGS. 3a and 3b, one embodiment is shown where the first series of wells is represented by the letter A, and the second series of wells is represented by the letter B. These wells are a series of blind holes laser drilled into the substrate to a desired depth, separated by a certain spacing. Specifically, in one embodiment, the first series of wells is made by setting the laser to an appropriate power level such that a substantial portion of the outline perimeter of an irregular shaped substrate is defined by laser drilling holes completely through the substrate material 18. The holes are made through the material 18, however the laser is operated in such a manner to allow a small amount of substrate material re-flow to occur at the bottom. This creates a well whereby the bottom of the well is connected to both the panel of substrate material 18 and the perimeter of the newly defined irregular shaped substrate. Alternatively, the first series of wells can be formed by drilling with the laser to a substantial depth of the substrate material 18. In either case, the depth of an individual well is defined with the air pressure and the pulse width( and the pulse width determines the power setting of the laser). When the laser power is set too high, the well becomes a hole which is completely opened and separated from the panel material, and thus the newly defined substrate will detach from the panel of substrate material 18. When the power is set too low, the well is too shallow and the substrate will not break from the panel of substrate material 18 without damaging the delicate portions of the irregularly shaped substrate. As discussed in further detail below, the appropriate laser parameters will vary with the thickness of the panel material to be drilled.

In the preferred embodiment, the first series of laser drilled wells are actually drilled very close to being right on top of one another, and each well is generally only separated by approximately 0.0007 inches. As an individual pulse these are wells, or blind holes; however when they are placed so close together they overlap and form a cut. The invention provides for re-flow at the bottom of the cut, and the result is a perforated like structure. The air flow plays an important role in forming the perforated cut. It is desirable to provide just enough air to separate the cut and allow for a small amount of re-flow.

Second, the remaining perimeter of the irregular shaped substrate is formed by a second series of laser drilled wells made by a different laser setting. This second series of wells B forms a tab or tack in the perimeter of the newly defined irregular shaped substrate. The tab does not protrude from the perimeter, but is an integral part of the perimeter, and serves to provide a more rigid attach point to the panel of substrate material 18. The tab has a spacing in the range of 0.003 to 0.008 inches, and preferably is 0.005 inches. The tab adds stability to the irregular shaped substrate formed in the panel material 18. Preferably, one tab is used along the perimeter of the irregular shaped substrate. In general, the placement of the tabs are dependent upon the geometry of the irregular shaped substrate. Preferably, the tab is located at a position opposite to where the laser begins the perimeter cut. This allows for the substrate to be supported during drilling of the second half of the perimeter. This is particularly important when cutting circuits that have interior cutouts as well as the perimeter cuts. The tabs may vary in length, and are preferably 0.050 inches.

Referring again to FIGS. 3a and 3b, the first series of wells A comprises a plurality of overlapping wells 22. Each well has a diameter d1 and the wells are spaced apart by spacing s1. The spacing s1 is measured from the centerline of each well 22. The overlapping wells form a cut. Reflow occurs at the bottom of the cut to form a substantially perforated cut. Where the reflow occurs, the resultant well is to a depth of approximately 85% of the total thickness t of the substrate material 18. The dimensions of the wells 22 will vary and are dependent on the type and total thickness t of the substrate panel material 18. The exemplary embodiment shown in FIG. 3 is for a substrate material with a 25 mil thickness t. Preferably for a substrate of 25 mil thickness, the depth is in the range of 20 to 24 mil. For the first series of wells A, the diameter d1 may range from 4 to 6 mil, with 5 mil being preferred, and the spacing s1 generally ranges from 0.5 to 1.0 mil, with 0.7 mil being preferred.

The second series of wells B comprises a plurality of wells 23, each well having a depth p2, a diameter d2 and the wells 23 are spaced apart by spacing s2. The spacing s2 is measured from the centerline of each well 23. The dimensions of the wells 23 will vary and are dependent on the type and total thickness t of the substrate panel material 18. Preferably for a substrate of 25 mil thickness, the depth is in the range of 20 to 24, and most preferably is approximately 85% of the total thickness t of the substrate material 18. For the second series of wells B, the diameter d2 generally ranges from 4 to 6 mil, with 5 mil being preferred, and the spacing s2 generally ranges from 3 to 15 mil, with 5 mil being preferred.

As shown, in the preferred embodiment, the depth, and the diameter d1 and d2 of wells 22 and 23 for both the first and second series of wells A and B are generally the same. The only parameter that varies is the spacing s1 and s2. The increased spacing s2 of the second series of wells B forms the tab, which adds mechanical stability to the perimeter of the irregular shaped substrate formed in the substrate material 18.

Figure 4A:
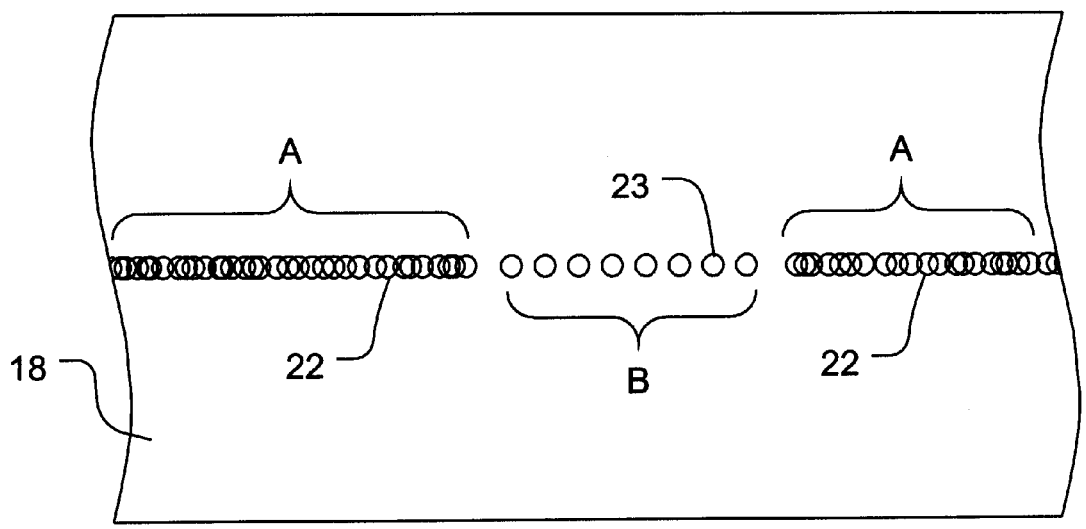
FIGS. 4a and 4b are a planar view and cross-sectional view, respectively, of a portion of a panel of substrate material showing first and second series of wells formed therein in accordance with an alternative embodiment of the present invention.
Figure 4B:
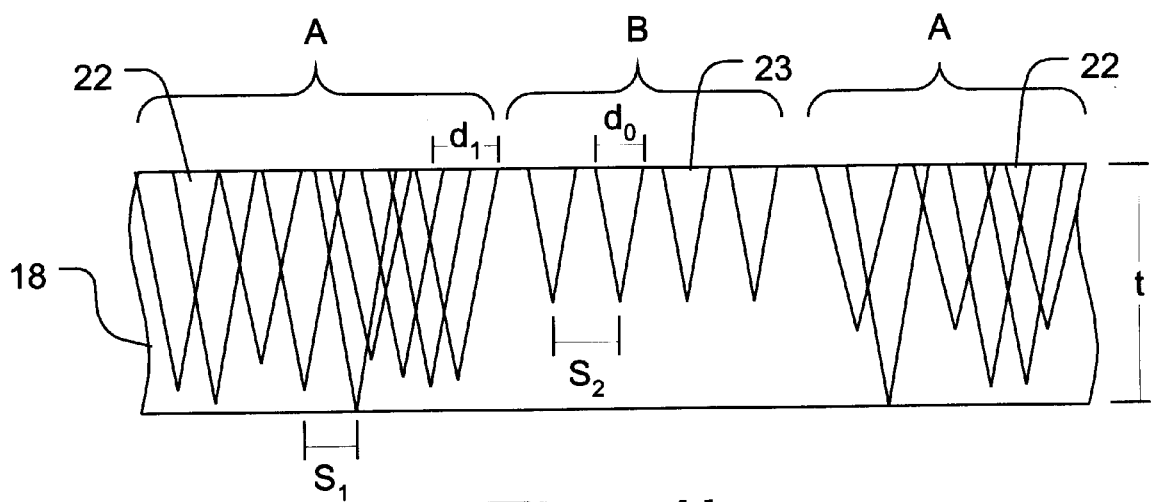

An alternative embodiment of the invention is shown in FIGS. 4a and 4b, illustrating a top view and cross-sectional view, respectively, of the first and second series of wells 22 and 23. In this embodiment, both the first and second series of wells are equally spaced, i.e., s1 is equal to s2. However, the depth of the first and second series of wells are different. In this embodiment, the depth of the first series of wells extends to a substantial depth of the substrate thickness, while the depth of the second series of wells extends to lesser depth. In this manner, the tab or tack is formed by the second series of wells by the lesser penetration into the substrate. For a 25 mil thick substrate, the preferred depth of the first series of wells is in the range of 80% to 95% of the thickness of the substrate, and the second series of wells is in the range of 40% to 70% of the thickness of the substrate.

To form the first and second series of wells A and B, synchronous laser pulsing is preferably used. This operating mode allows the laser 10 to track the distance that the table 20 moves, and the laser 10 is programmed using known techniques to fire a single pulse of energy at a specified distance and/or time. This will produce identical results at any set table travel speed.

Figure 5:
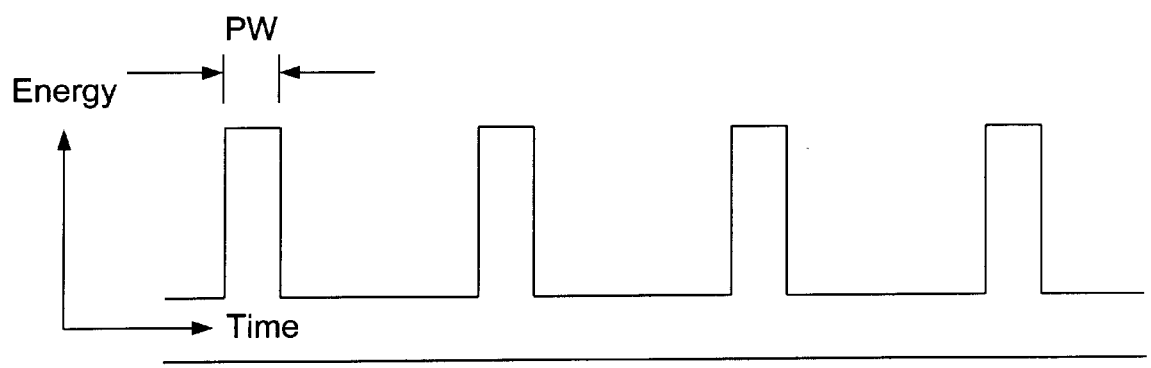
FIG. 5 is graphical representation of the pulse energy of a laser used in the method of the present invention.

As known in the art, the measure of the amount of energy being delivered by the laser 10 in a single pulse is called the pulse width, and may be represented by a graph shown in FIG. 5. The amount of energy provided by the laser is the integration of the laser power over the pulse width. FIG. 5 plots a laser pulse fired from a laser, in power as a function of time, and shows pulses of energy in the form of a square wave. The pulse lasts for a certain duration which is defined as the pulse width "pw" and is measured as energy in Joules per pulse. The longer the laser is on (i.e. longer pulse width) the higher the Joules per pulse.

Another important laser operation parameter is the firing distance between the pulses. This is the distance the substrate material or the table travels between the firing of each pulse. The firing distance may also be defined as the time between the firing of each pulse. The firing distance is measured from the center to center of each pulse as shown in FIG. 5. In the preferred embodiment, the firing distance is different for the first and second series of wells A and B, and the firing distance corresponds to spacing s1 and s2 as shown in FIGS. 3b and 4b. For the first series of wells A, the firing distance is generally in the range of 0.0005 to 0.001 inches, and is preferably 0.00078 inches. For the second series of wells B, the firing distance is generally in the range of 0.003 to 0.015 inches, and is preferably 0.005 inches. The preferred laser parameters for both the first and second series of wells A and B are summarized in Table 1 below:

TABLE 1

| Parameter | First Series of Wells A | Second Series of Wells B |
| --- | --- | --- |
| Resonator Current (mAmps) | 6 | 6 |
| Firing Distance (inches) | 0.00078 | 0.0047 |
| Assist Air Pressure (psi) | 25 | 15 |

Of particular advantage, the method of the present invention may be employed with substrates of varying thicknesses. To accommodate the different types of substrates, the pulse width parameter is changed as illustrated in Table 2 below. Preferably, the pulse width for the first and second series of wells A and B are the same.

TABLE 2

| Substrate Thickness (mil) | Pulse Wd Range (seconds) | Preferred Pulse Wd (seconds) |
| --- | --- | --- |
| 10 | 150 to 200 | 180 |
| 15 | 250 to 350 | 300 |
| 20 | 350 to 450 | 400 |
| 25 | 450 to 550 | 500 |

Table 3 shows the dimensions of the wells in the first and second series of wells A and B for different substrate thicknesses:

TABLE 3

| Substrate thickness (Mil) | perf. depth Wells A (in) | perf. spacing Wells A (in) | perf depth Wells B (in) | perf spacing Wells B (in) |
| --- | --- | --- | --- | --- |
| 10 | 0.0085 | 0.00078 | 0.0085 | 0.0047 |
| 15 | 0.01275 | 0.00078 | 0.01275 | 0.0047 |
| 20 | 0.017 | 0.00078 | 0.017 | 0.0047 |
| 25 | 0.02125 | 0.00078 | 0.02125 | 0.0047 |

Figure 6:
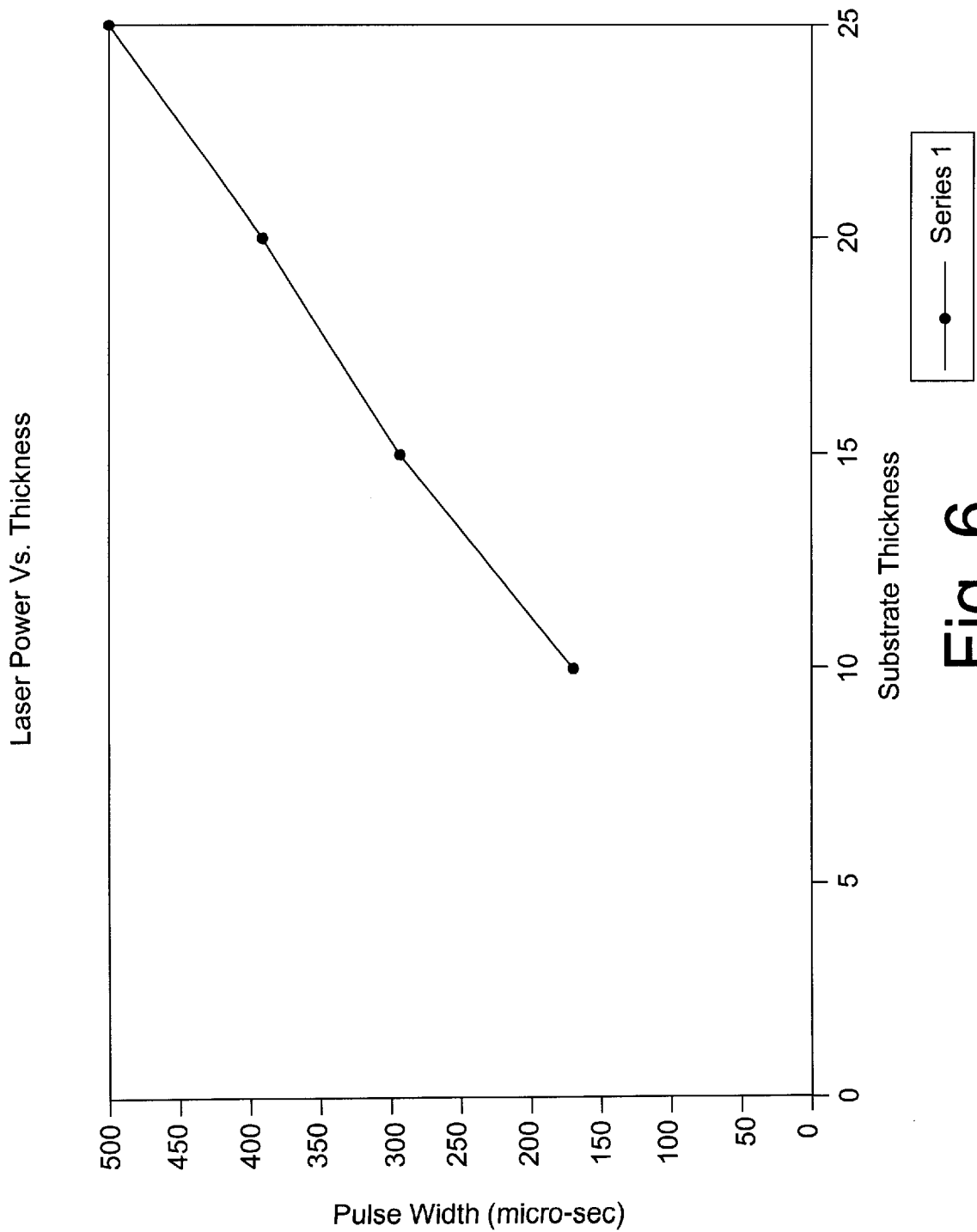
FIG. 6 is a graph depicting the laser pulse width as a function of the thickness of the panel of substrate material.

The data in Table 2 is illustrated graphically in FIG. 6. As shown, the relationship between the pulse width and the substrate thickness approximates a linear relationship. By extrapolating from the graph in FIG. 6, substrates with different thicknesses than those specifically shown here may be practiced with the present invention.

Figure 1:
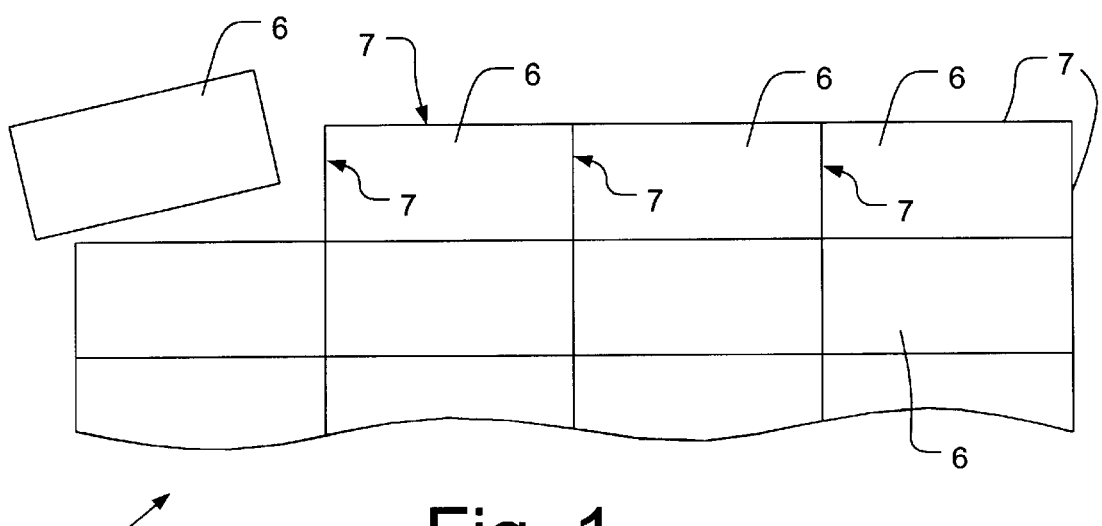
FIG. 1 shows a plurality of rectangular substrates formed in a panel of substrate material according to the prior art techniques.
Figure 7:
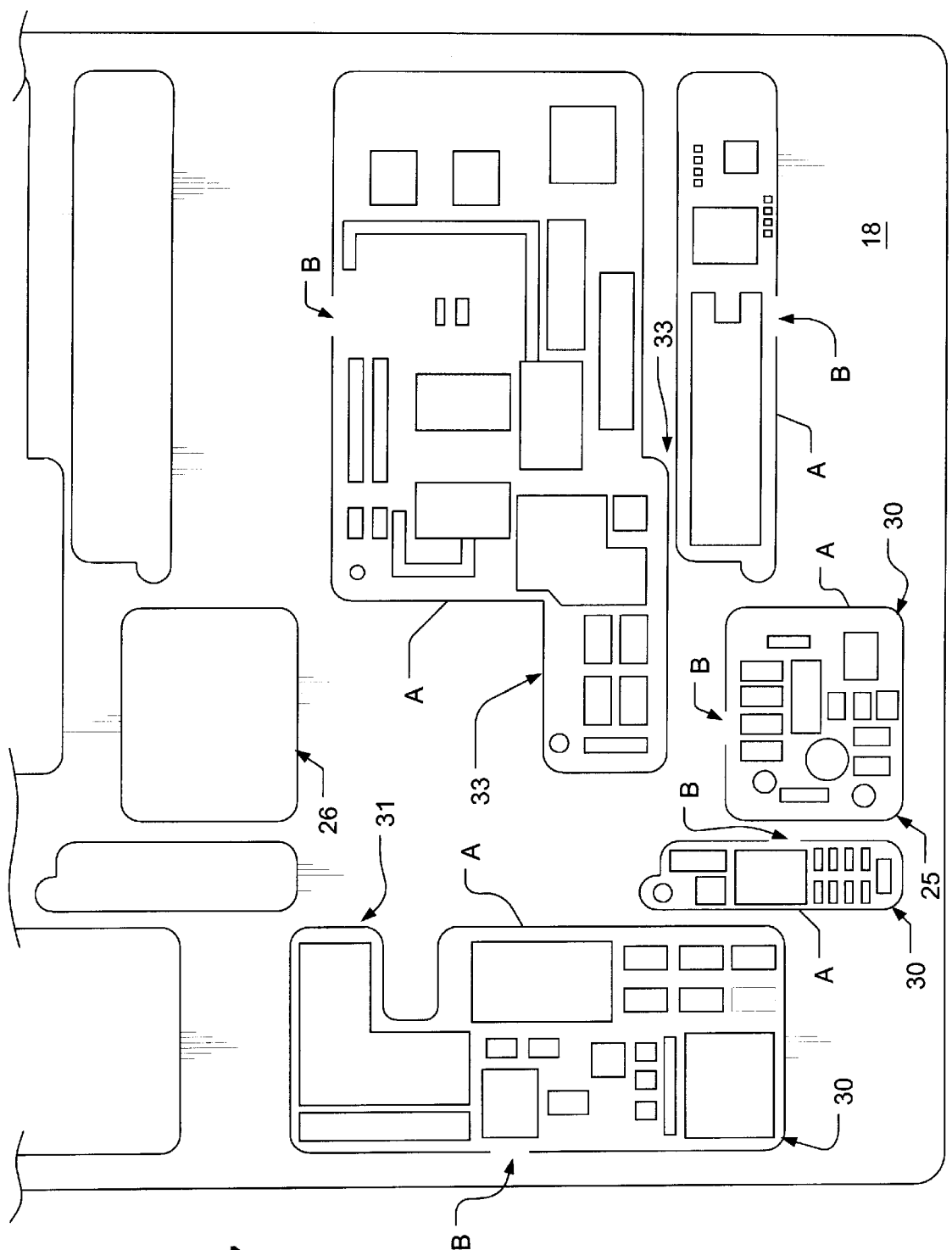
FIG. 7 is a photograph of irregular shaped substrates formed in a panel of substrate material, with some of the irregular shaped substrates punched out, in accordance with the present invention.

In sharp contrast to the rectangular substrates shown in FIG. 1, the irregular shaped substrates formed in accordance with the present invention are shown in FIG. 7. FIG. 7 shows a panel of substrate material 18 with a plurality of irregular shaped substrates 25 formed therein. Also shown is the panel 18 frame with a plurality of the irregular shaped substrates 26 removed. The first series of wells A form the substantial portion of the perimeter of each irregular shaped substrate and second series of wells B form the remaining portion of the perimeter. The first series of wells are slightly attached to the panel of substrate material 18, while the second series of wells B form the tab or tack which is a more rigid attach point to the panel of substrate material 18. Preferably, the first series of wells A forms approximately 98% of the perimeter. As illustrated, many shapes may be formed. In one embodiment, the irregular shaped substrates have a perimeter with rounded corners 30. In an alternative embodiment, the perimeter has at least one protrusion 31 portion extending perpendicular therefrom. In yet another embodiment, the irregular shaped substrate is comprised of a perimeter having a plurality of protrusion portions 33 extending therefrom.

Of particular advantage the method and substrates of the present invention provide for the easy removal of the irregular shaped substrates from the panel of substrate material. As discussed above, it is important that the attachment of the perimeter of the substrate be strong enough to withstand all of the processing to form the hybrid circuits thereon without breaking during laser processing, and yet be easily removed without breaking the delicate shapes of the substrate. The invention achieves this by employing the two types of wells and by employing the second series of wells as a tab or tack integral with the perimeter of the substrate and providing a relatively rigid attach point to the panel of substrate material. To detach the irregular shaped substrate one may simply hold the panel of substrate material and punch out the tab by breaking it with the blunt end of a pair of tweezers.

The substrate is held by a fixture during the laser drilling operation. Preferably, the substrates are mounted under the laser horizontally in a fixture that provides a light spring force on the top edge of the substrate. The fixtures may be machined to tight tolerances, such as ±0.001 inch, in order to insure that the substrate is held at the proper focal point of the laser. The inventor has found that if the substrate is located above or below the absolute focal point by more than about 0.003 inch, then the laser drilled wells or cuts become less sharp and a significant amount of power density is lost at the substrate.

The holding force exerted by the fixture spring mechanism is of importance. If too much force is used, the substrate will crack during processing. If too little force is used, the substrate will tend to shift during processing. The fixture spring mechanism employs multiple spring fingers, and preferably more than two fingers are used. When only two fingers are used, it is possible to impose a shear force on the substrate which may cause the substrate to break. The inventor has found that using a series of independent spring fingers across the entire top edge of the fixture is best for securing the substrate. Other forms of fixturing may be used, such as vacuum fixturing.

To define the perimeter of the irregular shapes, a CNC controlled laser is used in the preferred embodiment. Generally the CNC controller is programed using known techniques to drive the table to form the desired geometry of the perimeter of the irregularly shaped substrate. The controller is also programed to execute the laser parameters to make the first series of wells A and the parameters to make the second series of wells B at the appropriate time. More specifically, the laser is programmed to follow a simple set of position directions, with time to stop and set laser parameters between points. The points are provided by a computer program written in AutoLISP (a know programming language) that allows a computer programmer to create a drawing in a graphics system such as AutoCAD and then will translate the drawing into code that the laser will read. All of the tab locations, tab sizes, and perimeter start points are identified in the AutoCAD drawing. The AutoLISP program creates code that will tell the CNC controller to set parameters to make either the first or second type of wells. Accordingly, a method and apparatus have been described which overcomes the limitations of prior art techniques and which produces irregular shaped substrates.

The foregoing description of specific embodiments of the invention have been presented for the purpose of illustration and description. They are not intended to be exhaustive or to limit the invention to the precise forms disclosed, and obviously many modification, embodiments, and variations are possible in light of the above teaching. It is intended that the scope of the invention be defined by the claims appended hereto and their equivalents.

I claim:

1. A method of producing irregular shaped substrates from a panel of substrate material using a laser characterized in that a first and second series of wells are drilled in said panel by the laser to define the perimeter of each of said irregular shaped substrates, a substantial portion of said perimeter being made by said first series of wells having a first depth and separated by a first spacing, and the remaining portion of said perimeter being made by said second series of wells having a second depth and separated by a second spacing to provide an attach point to said panel, wherein said irregular shaped substrate is retained in said panel of substrate material without breaking.

2. The method of claim 1 wherein said second spacing is greater than said first spacing.

3. The method of claim 1 wherein said first and second spacing are equal.

4. The method of claim 1 wherein said first depth is greater than said second depth.

5. The method of claim 1 wherein said first and second depth are equal.

6. The method of claim 1 wherein said first spacing is in the range of substantially 0.00070 to 0.00082 inches.

7. The method of claim 1 wherein said second spacing is in the range of substantially 0.0040 to 0.0052 inches.

8. The method of claim 1 wherein said panel of substrate material has a thickness in the range of substantially 10 mil to 25 mil.

9. The method of claim 1 wherein said first and second series of wells are drilled with a laser pulse width in the range of substantially 180 to 500 microseconds.

10. The method of claim 1 wherein the thickness of said panel of substrate material is approximately 10 mil and said laser operates at a pulse width of approximately 180 microseconds.

11. The method of claim 1 wherein the thickness of said panel of substrate material is approximately 15 mil and said laser operates at a pulse width of approximately 300 microseconds.

12. The method of claim 1 wherein the thickness of said panel of substrate material is approximately 20 mil and said laser operates at a pulse width of approximately 400 microseconds.

13. The method of claim 1 wherein the thickness of said panel of substrate material is approximately 25 mil and said laser operates at a pulse width of approximately 500 microseconds.

14. A method of producing irregular shaped substrates from a panel of substrate material using a laser, comprising the steps of:

making a first perforated laser cut having a perforation spacing, in said panel of substrate material to define a substantial portion of a perimeter of said irregular shaped substrates; and making a second series of wells having a depth and separated by a spacing, to form a remaining portion of the perimeter of said irregular shaped substrate and where said second series of wells provides an attach point to said panel;

wherein said irregular shaped substrates are retained in said panel without breaking until said irregular shaped substrates are detached from said panel.

15. The method of claim 14 wherein said spacing is greater than said perforation spacing.

16. The method of claim 14 wherein said perforation spacing and said spacing are equal.

17. The method of claim 14 wherein the step of making said first perforated laser cut and said second series of wells further comprises operating said laser at a pulse width in the range of substantially 180 to 500 microseconds.

18. The method of claim 14 wherein said panel of substrate material has a thickness in the range of substantially 10 mil to 25 mil.

19. The method of claim 14 wherein the thickness of said panel of substrate material is approximately 10 mil and said laser operates at a pulse width of approximately 180 microseconds.

20. The method of claim 14 wherein the thickness of said panel of substrate material is approximately 15 mil and said laser operates at a pulse width of approximately 300 microseconds.

21. The method of claim 14 wherein the thickness of said panel of substrate material is approximately 20 mil and said laser operates at a pulse width of approximately 400 microseconds.

22. The method of claim 14 wherein the thickness of said panel of substrate material is approximately 25 mil and said laser operates at a pulse width of approximately 500 microseconds.

23. The method of claim 14 wherein said spacing is in the range of substantially 0.0040 to 0.0052 inches.

24. The method of claim 14 wherein said perforation spacing is in the range of substantially 0.00070 to 0.00082 inches.

25. A method of producing circuits having irregular shaped substrates from a panel of substrate material using a laser, comprising the steps of:

forming said circuits on said panel of substrate material;

making a first series of wells having a first depth separated by a first spacing, in said panel of substrate material, to define a substantial portion of a perimeter of said irregular shaped substrates; and making a second series of wells having a second depth and separated by a second spacing, to form a remaining portion of the perimeter of said irregular shaped substrate and to form an attachment area to said panel, wherein said irregular shaped substrate is retained in said panel of substrate material without breaking; and detaching said substrate and said circuit from said panel of substrate material.

26. The method of claim 25 wherein said second spacing is greater than said first spacing.

27. The method of claim 25 wherein said first and second spacing are equal.

28. The method of claim 25 wherein said first depth is greater than said second depth.

29. The method of claim 25 wherein said first and second depth are equal.

30. The method of claim 25 wherein said first spacing is in the range of substantially 0.00070 to 0.00082 inches.

31. The method of claim 25 wherein said second spacing is in the range of substantially 0.0040 to 0.0052 inches.

32. The method of claim 25 wherein the steps of making said first and second series of wells further comprises operating said laser at a pulse width in the range of substantially 180 to 500 microseconds.

33. The method of claim 25 wherein said panel of substrate material has a thickness in the range of substantially 10 mil to 25 mil.

34. The method of claim 25 wherein the thickness of said panel of substrate material is approximately 10 mil and said laser operates at a pulse width of approximately 180 microseconds.

35. The method of claim 25 wherein the thickness of said panel of substrate material is approximately 15 mil and said laser operates at a pulse width of approximately 300 microseconds.

36. The method of claim 25 wherein the thickness of said panel of substrate material is approximately 20 mil and said laser operates at a pulse width of approximately 400 microseconds.

37. The method of claim 25 wherein the thickness of said panel of substrate material is approximately 25 mil and said laser operates at a pulse width of approximately 500 microseconds.

38. The method of claim 25 wherein said circuits form a receiver.

39. The method of claim 25 wherein a plurality of said circuits are made from a single photomask.

40. The method of claim 25 further comprising:

holding said panel of substrate material with a fixture, said fixture having a plurality of springs for engaging said panel of substrate material with a force such that said panel does not significantly shift or break.

41. The method of claim 14 wherein a plurality of said irregular shaped substrates are made from a single photomask.

* * * * *